Figure 1:
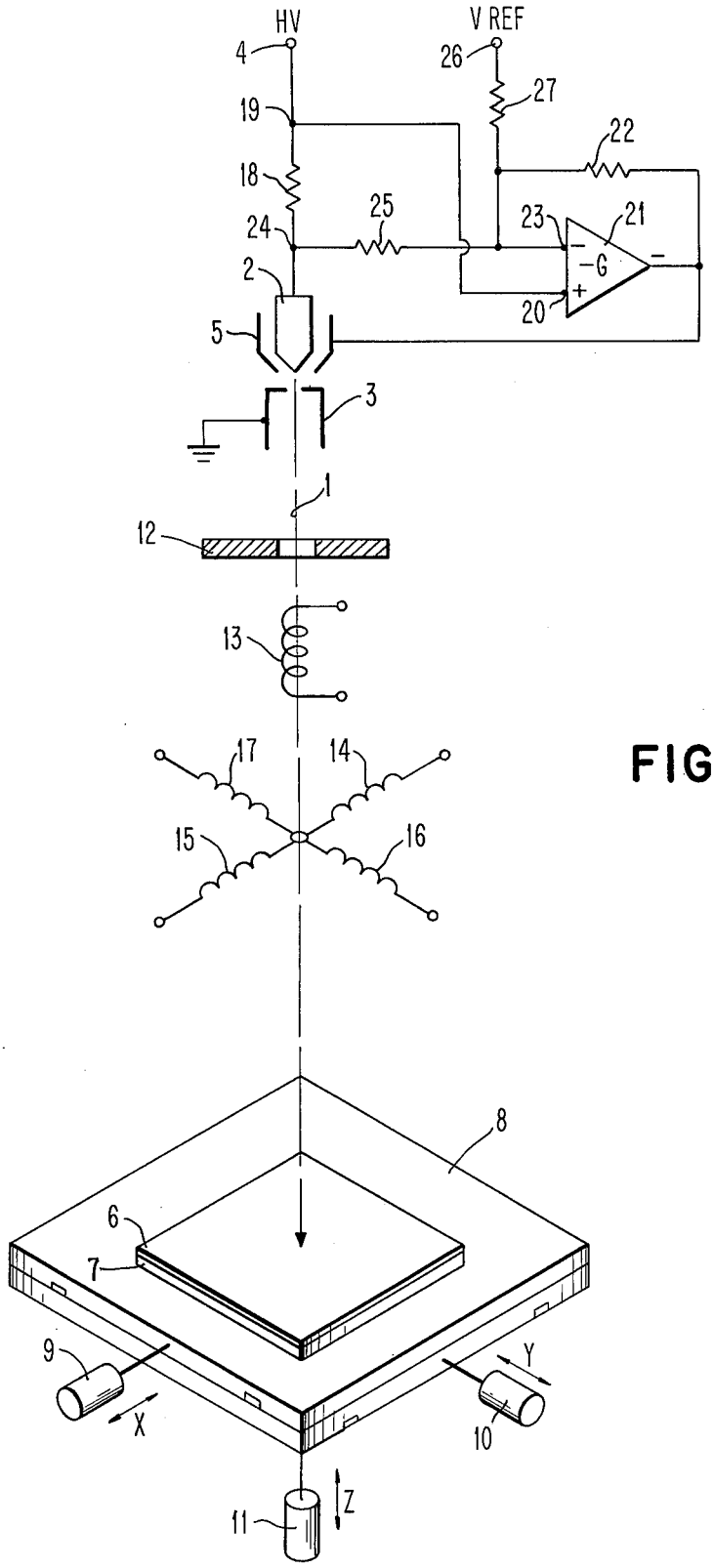
Figure 2:
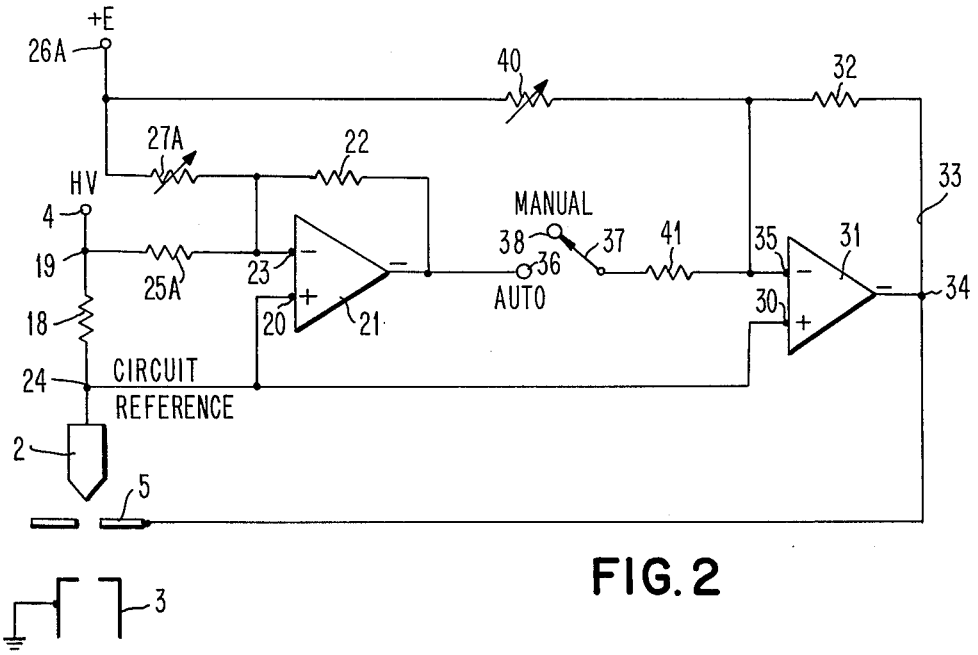
Figure 3:
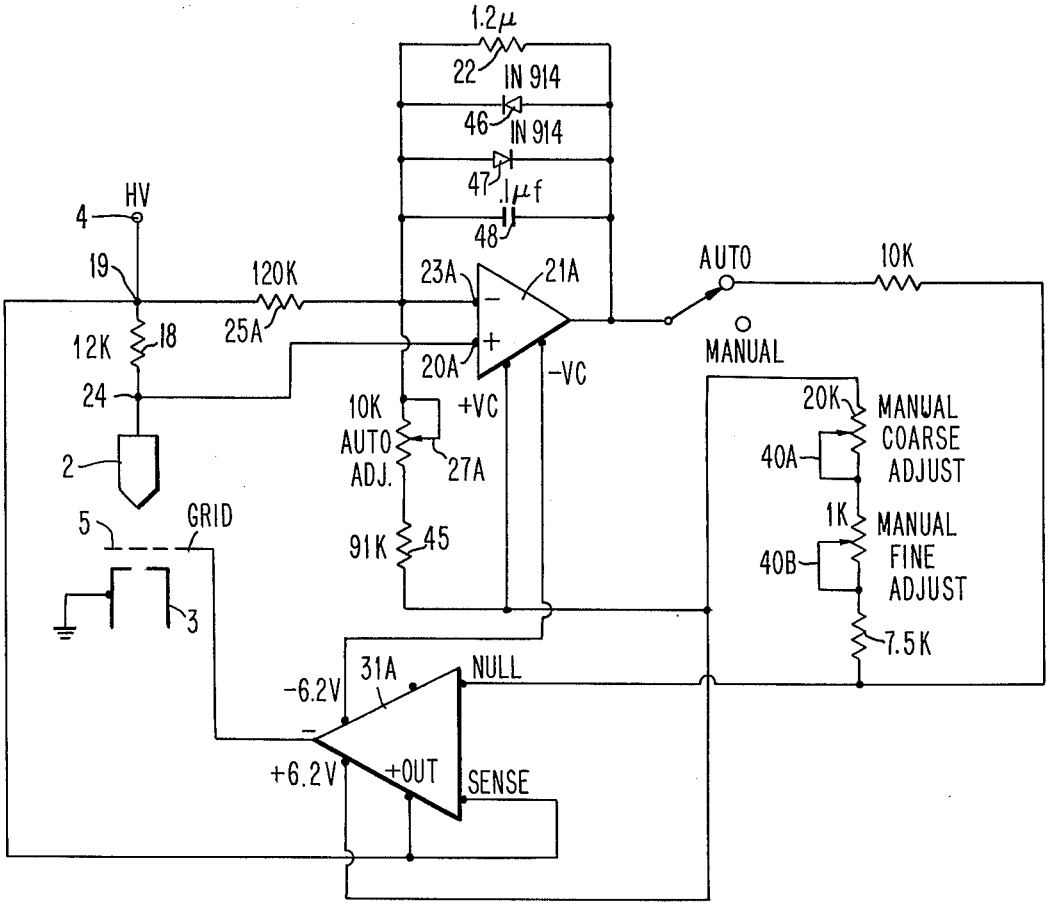

United States Defensive Publication [19] (H) [11] T961,002

Hall et al. [43] Aug. 2, 1977

[54] ELECTRON CURRENT REGULATOR FOR AN ELECTRON DISCHARGE DEVICE

[75] Inventors: Alan V. Hall, Wappingers Falls; Ollie C. Woodard, Poughkeepsie, both of N.Y.

[73] Assignee: International Business Machines Corporation, Armonk, N.Y.

[21] Appl. No.: 730,548

[22] Filed: Oct. 7, 1976

Related U.S. Application Data

[63] Continuation of Ser. No. 542,462, Jan. 20, 1975, abandoned, which is a continuation of Ser. No. 268,284, July 3, 1972, abandoned.

[51] Int. Cl.[2] ..... H01J 37/30; H05B 7/02

[52] U.S. Cl. ..... 315/107; 219/121 EB; 315/307; 315/311

[57] ABSTRACT

Circuit for controlling the electron discharge from a cathode, of an electron discharge device, which provides a control voltage signal, proportional to the cathode current, for comparison with a reference value to provide a correction bias to a grid interposed between the cathode and an anode.

10 Claims, 2 Sheets Drawing,

26 Pages Specification

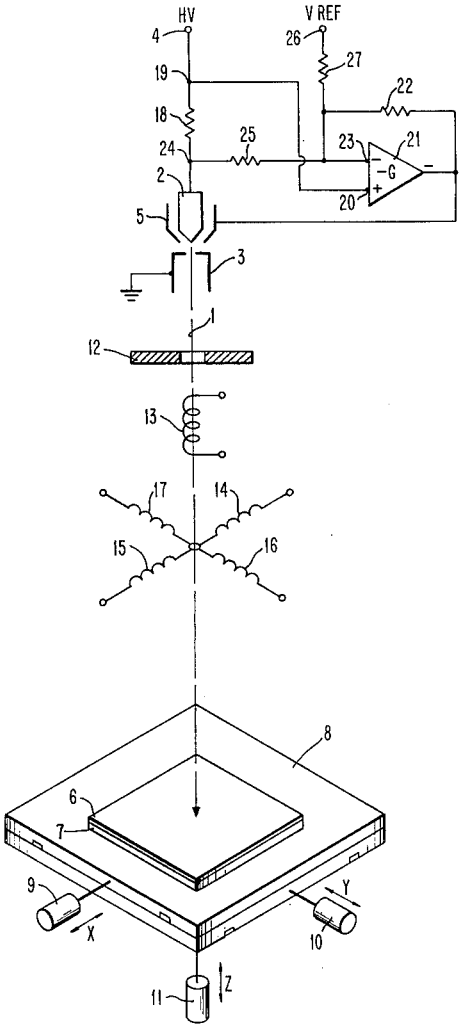

The file of this unexamined application may be inspected and copies thereof may be purchased (849 O.G. 1221, Apr. 9, 1968).